United States Patent

[11] 3,627,192

[72] Inventor William A. Killingsworth
Glendora, Calif.

[21] Appl. No. 795,910
[22] Filed Feb. 3, 1969
[45] Patented Dec. 14, 1971

[73] Assignee Bearings, Seals & Gears, Inc.
Redwood City, Calif.

[54] WIRE LEAD BONDING TOOL
7 Claims, 8 Drawing Figs.

[52] U.S. Cl. ........ 228/54, 219/229, 228/1, 228/3
[51] Int. Cl. ........ B23k 3/02
[50] Field of Search ........ 228/1, 3, 54, 55; 219/229; 126/263

[56] References Cited

UNITED STATES PATENTS

| | | | |
|---|---|---|---|
| 3,116,655 | 1/1964 | Esopi | 228/4 |
| 3,128,648 | 4/1964 | Clagett | 228/4 |
| 3,347,442 | 10/1967 | Reber | 228/4 |
| 3,305,157 | 2/1967 | Pennings | 228/1 |
| 3,461,538 | 8/1969 | Worcester et al. | 29/423 |

OTHER REFERENCES

IBM Technical Disclosure Bulletin, Vol. 10, No. 12, May 1968, 228/1

*Primary Examiner*—John F. Campbell
*Assistant Examiner*—R. J. Craig
*Attorney*—Flehr, Hohbach, Test, Albritton & Herbert

ABSTRACT: A bonding tool for wire lead bonding including a relatively stiff shank, a wire guide and a bonding tip of relatively hard, slightly ductile, inert material.

INVENTOR.
WILLIAM A. KILLINGSWORTH
BY
Flehr, Hohbach, Test, Albritton & Herbert
ATTORNEYS

WIRE LEAD BONDING TOOL

BACKGROUND OF THE INVENTION

This invention relates generally to a bonding tool for bonding wire leads and more particularly to such a tool for use in the semiconductor industry.

After a semiconductor device has been manufactured and attached to its package, it is necessary to make electrical connections between the contact areas on the device and the package leads. In hybrid circuits, it is often necessary to make connections between individual circuit elements on the device itself.

The most commonly used methods for integrated and hybrid circuits are by bonding with either a thermocompression bonding machine or an ultrasonic bonding machine. In thermocompression bonding, the wire lead is brought into engagement with the contact area and by the simultaneous application of heat and pressure to the tool, the lead is attached to the contact area. In ultrasonic bonding, the wire lead is brought into engagement with the contact area, and pressure and ultrasonic energy are applied to the tool whereby the two metals are rubbed together. The oxide layer is penetrated, the molecules of the lead and contact area intermix and a bond is produced.

One type of prior art bonding tool is a so-called wedge bonding tool. The wedge end of the tool is brought into pressure contact with the wire over the area to be contacted and either a thermocompression or ultrasonic bond is formed. The tool is then lifted, the next contact area brought into registry with the wedge and another bond is formed to thereby form a connection between the two areas; for example, between an area on the device and a package lead, or in hybrid circuits, between two ohmic areas on the device itself. Another type of bonding tool is the so-called capillary bonding tool.

It is apparent that the bonding end of the tool is subjected to stresses, heat and abrasion during the bonding process. This has resulted in rapid wear of the bonding tool requiring frequent replacement.

SUMMARY OF THE INVENTION AND OBJECTS

It is an object of the present invention to provide an improved bonding tool.

It is another object of the present invention to provide a bonding tool which includes a tip of a relatively hard, ductile, relatively inert material and a wire guide.

The above objects are accomplished by a wire bonding tool including an end of one or more materials and a shank of another material with a wire guide adapted to present a wire to the end. In a wedge bonding tool the shank is preferably stiff and hard to minimize loss of ultrasonic energy and provide a maximum modulus of elasticity in the direction of scrubbing. The heel portion of the end is preferably of a dense abrasion-resistant inert material that will not abrade the wire and collect oxides which would tend to plug the wire guide. The tip of the wedge bonding tool or of a capillary tool is preferably of a finely porous abrasion-resistant material which tends to grip the wire and which does not wear rapidly as a result of repeated bonding operations.

The foregoing and other objects of the invention will be more clearly apparent from the following description taken in connection with the accompanying drawings.

DESCRIPTION OF THE PREFERRED EMBODIMENT

Figure 1:
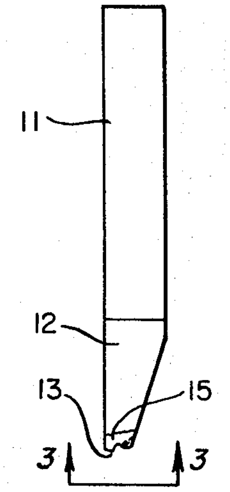
FIG. 1 is a side elevational view of a wedge bonding tool in accordance with the invention.
Figure 2:
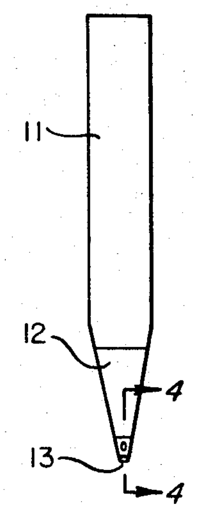
FIG. 2 is a front elevational view of the bonding tool shown in FIG. 1.
Figure 3:
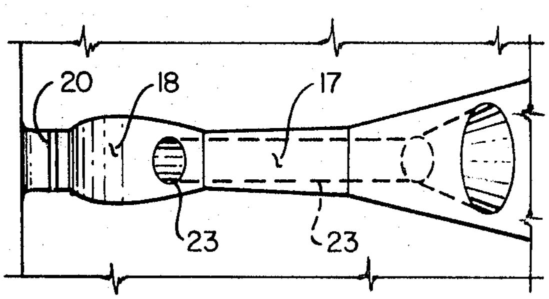
FIG. 3 is an enlarged bottom view of the bonding tool shown in FIG. 1.

Referring to FIGS. 1–3, the bonding tool shown includes a shank portion 11 having an integral end 12 at one end. The end 12 defines an edge 13 having a tip 16 and heel 17 with an intermediate recess portion or groove 18. The tip 16 protrudes beyond the heel 17 whereby it engages an associated surface or wire for bonding. In accordance with the present invention, portion 15 of the end 12 is composed of a material which is different from the remainder of the bonding tool. In one embodiment of the invention, the portion 15 comprises a material which is ductile, finely porous, and abrasion-resistant to provide gripping of the wire to limit relative movement between the tip 16 and wire to minimize wear of the tip and to maintain its geometry. The material forming the portion 15 should also have a low thermal conductivity to confine the heat generated to the bonding region. In one instance, which is presently considered the preferred embodiment, a satisfactory and improved bonding tool was made with a tungsten carbide shank portion 11 with the portion 15 of the end 12 which defines the tip and heel comprising osmium fused or brazed to the end of the wedge. As used herein osmium has reference to a sintered alloy having a high percentage of osmium such as M310 Osmium Alloy sold by Goldsmith Brothers, Division of National Lead, Chicago, Ill. Other materials meeting the above may be used for the portion 15. For example, other refractory alloys where rhodium, iridium, palladium, tantalum, chromium, molybdenum comprise a major constituent and diamond or alloys thereof.

The edge tip may include a transverse groove 20 and a small radius corner 22 for purposes to be presently described. The groove enhances transmission of energy into the wire being bonded. The heel is provided with an opening 23 which serves to guide the wire towards the edge tip. The wire projects through the opening 23, into the recessed portion 18 and under the tip 16 whereby it can be forced against an associated contact area or surface for bonding. The material of the end portion is smooth and dense providing low abrasion and reducing the likelihood of plugging of the opening due to collection of oxide abraded from the wire.

Figure 4:
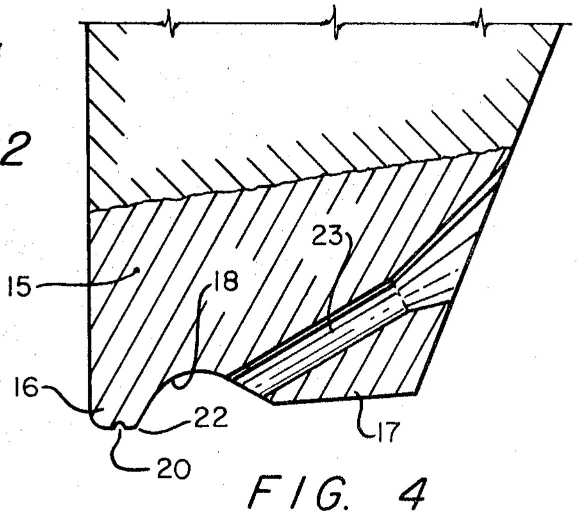
FIG. 4 is an enlarged sectional view of the end portion of the bonding tool shown in FIG. 1.
Figure 5:
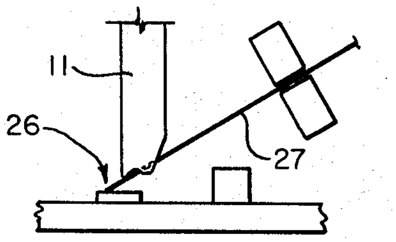
FIGS. 5–7 show the steps in connecting a wire between two contact areas.
Figure 6:
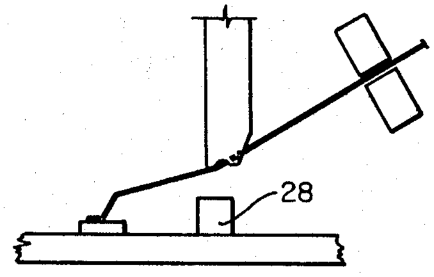
Figure 7:
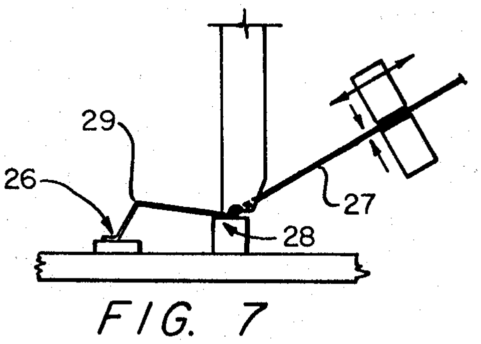

Referring to FIGS. 5 through 7, use of the bonding tool to provide contacts between two points is schematically illustrated. The wire is positioned by inserting through the wire guide and over the first contact area 26 with the bonding tool 11 positioned above the contact area. When the contact area 26 is properly positioned, the bonding tool 11 is lowered to press the wire 27 against the contact area. Suitable heat tone and/or ultrasonic energy is applied to thereby create a bond. The tool is then lifted and a new contact area 28 s brought into registry with the tool guiding the wire. The tool is lowered and a new bond is formed. While the tool is in its lowered position pressing against the wire, the tool is rocked and the wire 27 is pulled whereby the precisely radiused corner 22, FIG. 4, weakens the wire for break off leaving a lead portion 29 which extends between and interconnects the contact areas 26 and 28.

We have found that if the radius of the corner 22 is sharp, it may imprint the wire at the first bond and tend to weaken the loop between the two bonds. Thus, there must be a balance between a sharp corner which would facilitate breaking the wire and a rounded corner which would reduce imprinting and weakening of the loop but make breaking more difficult. We have found that a radius in the range of 0.0002—0.0008 inch gives satisfactory results in this regard.

Figure 8:
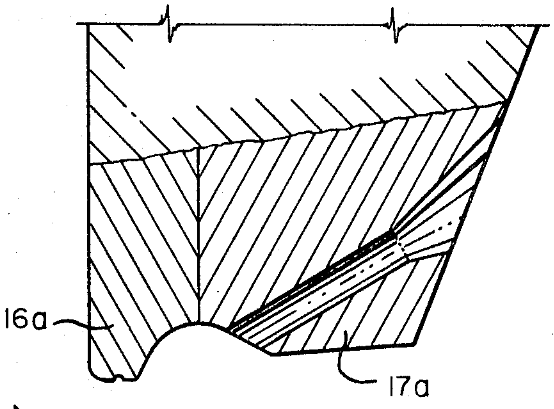
FIG. 8 is an enlarged sectional view of the end of another bonding tool.

Referring to FIG. 8, there is shown the end portion of another bonding tool. The portion 15 of the end is formed of two materials; a first material which defines the tip **16*a*, and a second material which defines the heel 17*a***. By use of two materials, a more satisfactory tool can be formed in that the characteristics of the material forming both the tip and the heel can be selected. The heel material is homogeneous, smooth material which is not affected by wire oxides and other material carried on the surface of the wire. It is a hard, dense material that does not abrade the wire or collect oxides. Preferably, the material is stainless steel or an alloy. The tip is formed of a ductile, finely porous, abrasive-resistant material which grips the wire. The bonding tool may comprise a so-called capillary tool in which a capillary or hole leads to the tip which engages the wire to be bonded.

Tests have shown that a tungsten carbide bonding tool with an osmium tip edge has a life of as much as five times the life of a conventional tungsten carbide bonding tool.

Thus, it is seen that there has been provided an improved bonding tool which has a more wear-resistant hardened tip to withstand the destructive environment to which it is subjected during bonding operations while the remainder of the bonding tool can be easily machined and processed to form the wire guide.

I claim:

1. A wire bonding tool for bonding lead wires to contact areas including a shank of material having a high modulus of elasticity with an end portion of another material, said end portion having a bonding area and a wire guide means, said other material being an osmium metal alloy having the properties of being slightly ductile, finely porous and abrasion-resistant for engaging the wire at the bonding area.

2. A wire tool as claim 1 wherein said shank portion consists substantially of tungsten carbide to provide said high modulus of elasticity.

3. A wire bonding tool as in claim 1 wherein said end portion includes a tip and a hole to guide the wire and present the wire to the tip.

4. A wire bonding tool for bonding lead wires to contact areas including a shank of one material with an end portion of another material, said portion of another material including a tip and a heel, said tip protruding beyond the heel whereby the tip engages the wire to be bonded said tip including a precisely radiused corner opposite said heel for severing the associated wire, and a hole formed in said heel to guide the wire and present it to the tip said other material being an osmium metal alloy.

5. A wire bonding tool as in claim 4 wherein said tip includes a groove.

6. A wire bonding tool as in claim 4 wherein said tool includes a recess between the tip and heel and said hole opens into said recess opposite said corner.

7. A wire bonding tool as in claim 4 wherein said shank consists substantially of tungsten carbide to provide a high modulus of elasticity.

* * * * *